United States Patent [19]

Hunt

[11] 4,191,128

[45] Mar. 4, 1980

[54] VACUUM METALLIZING OF HOLLOW ARTICLES

[76] Inventor: Claude J. L. Hunt, Hinton Hall, Peterchurch, Herefordshire, England

[21] Appl. No.: 958,434

[22] Filed: Nov. 7, 1978

[30] Foreign Application Priority Data

Nov. 19, 1977 [GB] United Kingdom ............... 48253/77

[51] Int. Cl.² ....................... C23C 13/02; C23C 13/12
[52] U.S. Cl. ................................... 118/720; 118/727; 118/728
[58] Field of Search ................. 118/715, 727, 728, 720

[56] References Cited

U.S. PATENT DOCUMENTS

| | | | |
|---|---|---|---|
| 1,621,016 | 3/1927 | Jackson | 427/238 X |
| 2,160,714 | 5/1939 | Biggs | 118/721 |
| 2,508,509 | 5/1950 | Germer et al. | 427/239 X |
| 2,730,987 | 1/1956 | Nelson | 118/704 |
| 3,246,627 | 4/1966 | Loeb et al. | 427/255 X |
| 3,277,864 | 10/1966 | Hopstaken | 118/504 X |
| 3,598,957 | 8/1971 | Yasuda et al. | 118/724 X |
| 3,748,169 | 7/1973 | Keller | 427/87 X |
| 3,751,539 | 8/1973 | Reuschel et al. | 118/715 |
| 3,915,117 | 10/1975 | Schertler | 118/719 |
| 4,036,171 | 7/1977 | Ramet | 427/259 X |

Primary Examiner—James R. Hoffman
Attorney, Agent, or Firm—Wender, Murase & White

[57] ABSTRACT

A vacuum metallizing apparatus for coating hollow articles such as tap bodies includes a carrier defining a shallow cylindrical chamber which is arranged for connection to a high vacuum source through valves. The carrier provides a plurality of ports with seatings in each of which a hollow article may be received with the interior of the article opening to the chamber. A filament assembly is mounted inside the chamber for rotation so that during evaporation of the coating metal on the filament, the filament sweeps past each port while the chamber including the interior of each hollow article is at high vacuum. Two different types of carrier are described, and a double or alternating type of arrangement of the carriers is described as well.

10 Claims, 8 Drawing Figures

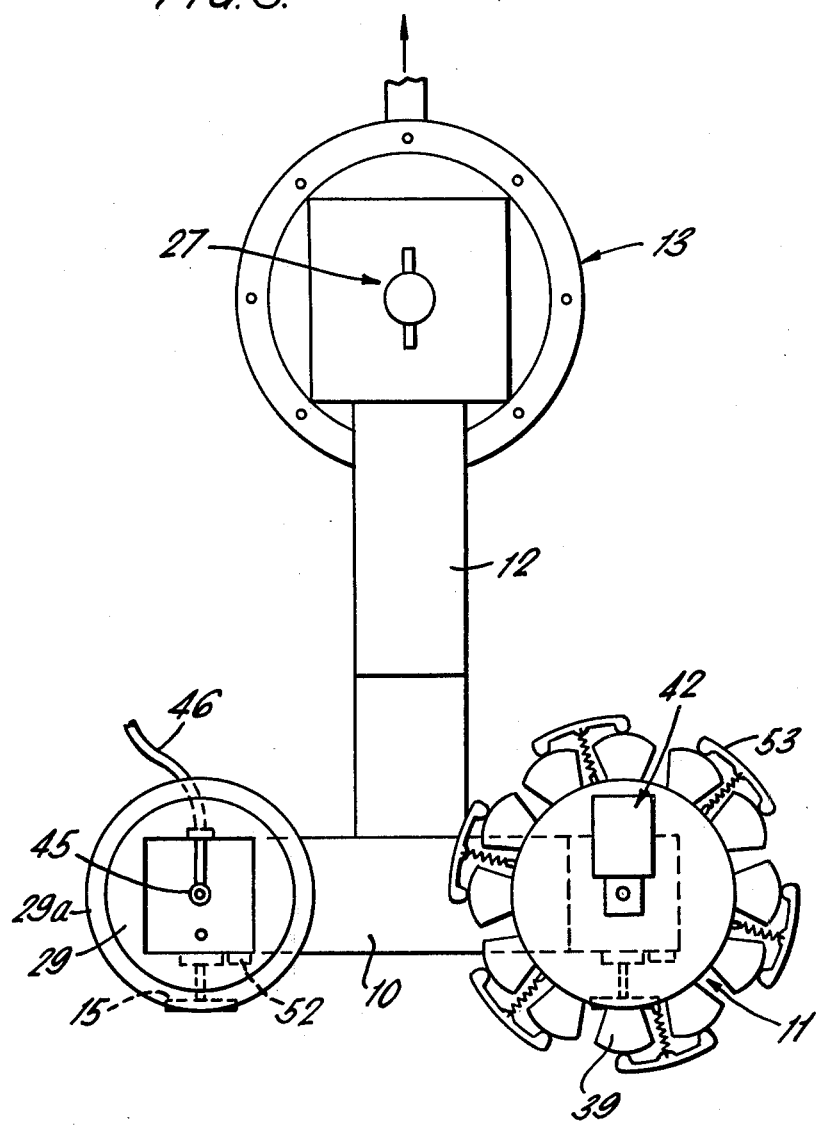

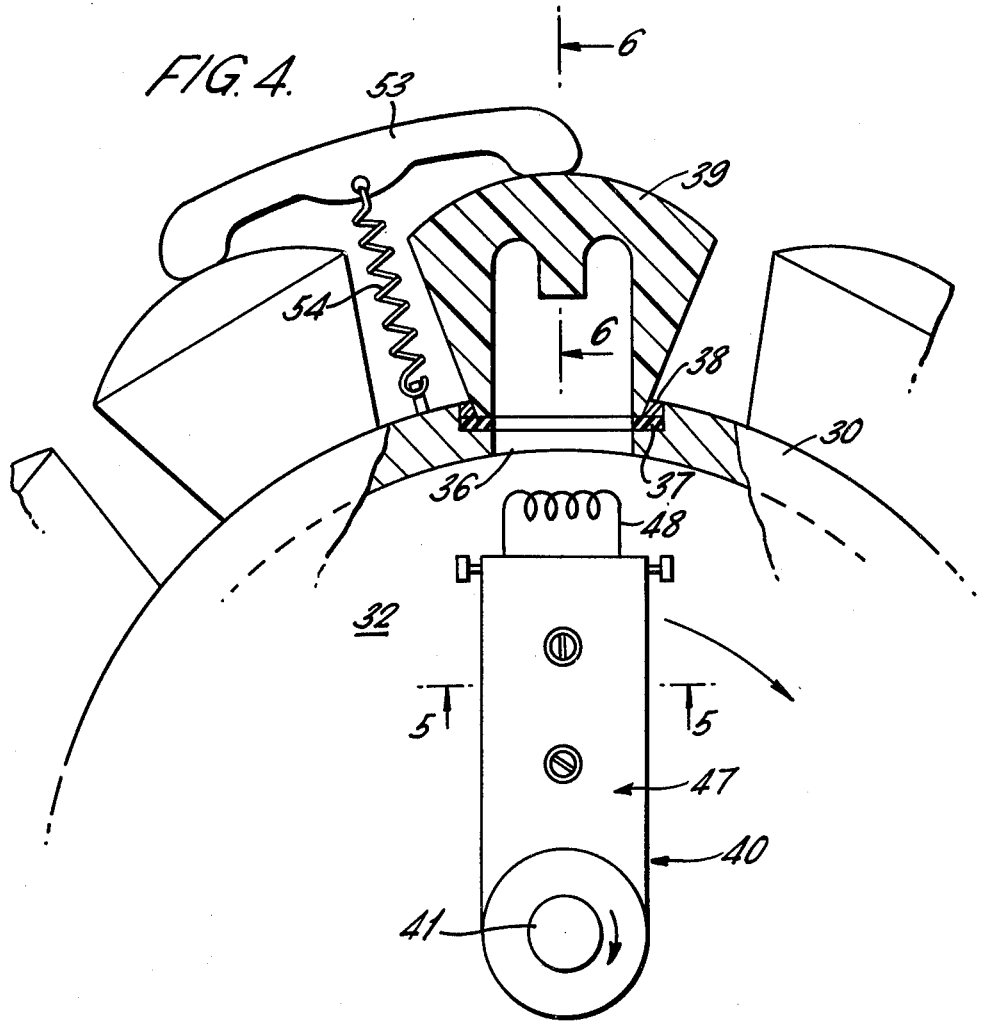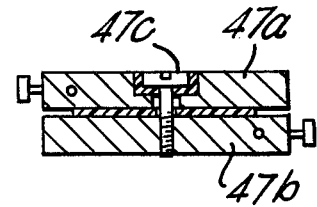

VACUUM METALLIZING OF HOLLOW ARTICLES

BACKGROUND OF THE INVENTION

1. Field of the Invention

This invention relates to vacuum metallising hollow bodies, in particular hollow bodies such as tap knob bodies, handles, control knobs or the like made of plastics material.

2. Description of the Prior Art

I have already devised certain improvements which are the subject of my earlier application for patent, Ser. No. 833,340 and which also relate to metallising hollow bodies. I have found that the use of a large vacuum chamber can be avoided by only reducing the interior of the hollow body to high vacuum and providing a special filament assembly by which the coating metal is vaporised adjacent an opening or mouth of the hollow body.

With my prior arrangement the production rate was limited whilst all the ancillary equipment for inducing high vacuum had to be provided, and this includes gauges, pumps, reservoirs and sequence control switches with all of the essential safety arrangements. This meant that the initial cost of the apparatus was high, and the production rate not fast enough in some installations to cope with demand and uneconomic.

Additionally, I found that certain problems arose in providing a consistent high quality coating from vaporising the coating metal within or closely adjacent to the mouth of the hollow body. Defects of finish were not acceptable where, as is usually the case, the plastics material is translucent and the metallised coating is diplayed and viewed through the body. These problems arose because variations in the design of the interior of the hollow bodies, and the fact that in many instances, the plastics material exudes impurities such as gasses during the reduction to high vacuum, and these gasses interfere with the deposition of the coating metal in an uniform and uncontaminated manner. It will be understood that the quality of the eventual coating is dependent on the pure controlled composition of the coating metal from its vaporised state.

SUMMARY OF THE INVENTION

According to this invention I provide a vacuum metallising process or apparatus for coating the inside of hollow articles characterised in that a carrier for a plurality of said articles has a plurality of seatings each for receiving a hollow article, the carrier being hollow and connected to a high vacuum source through suitable valve means, a filament assembly mounted inside the carrier for movement relative to the carrier so that the filament carrying the coating metal can be moved past and adjacent to each of the seatings during evaporation of the coating metal under high vacuum when a plurality of hollow articles are each engaged with each respective seating and the interior of each article is at high vacuum.

By this invention, a plurality of seatings are provided, for example more than six, to increase the number of articles that can be coated in one cycle of loading, reduction to high vacuum, evaporation of the coating metal, and relieving the vacuum and unloading. The seatings may be of any suitable shape for the article and comprise ports opening to the interior of the carrier.

In this invention, the filament assembly is arranged to move successively past the plurality of seatings more than once whilst the coating metal is vaporised so that each interior of the hollow article receives a 'flash' of coating when the filament passes. During the time between successive depositions, any gasses or other effects occurring within the hollow article are removed or subside so that a consistent quality and colour coating is achieved with the succession of intermittent 'flashes'. Additionally, as the interior configuration may be complex, the movement of the filament relative to the seating obviates some of the problems arising with uniformity of coating.

Preferably the carrier provides a shallow cylindrical chamber of which the lower wall opens to an isolation valve for controlling the communication of the chamber with the high vacuum source, and the carrier is provided with a plurality of ports arrayed in a circle at spaced apart positions with each port having a seating for receiving a respective hollow article.

The number of ports and their relative spacing may be selected in accordance with the shape and dimensions of the particular type of hollow article to be coated internally. The carrier may be an assembly of parts whereby changes in the size of ports and their relative disposition may be made quickly in use by interchanging one or more parts of the carrier.

The filament assembly is mounted for rotation about an axis which is co-axial with the longitudinal axis of the chamber defined by the carrier. The filament assembly preferably comprises an arm carrying the filament which is arranged and adapted to support the coating metal for vaporisation, and the arm is carried on a shaft which is adapted for driving by a motor.

The length of the arm with the filament is selected so that the filament is caused to rotate past the ports in the carrier adjacent thereto during the vaporisation cycle of metallising. As will be appreciated, the length of the arm and the type of filament can also be varied to accommodate changes in the disposition and size of the ports and the hollow articles to be coated internally.

Conveniently, the filament assembly includes a vertical shaft which is driven by the motor, and the arm carrying the filament is arranged to extend and sweep round in a substantially horizontal plane. This is an advantage where the coating metal is in the form of wire and is suspended on the filament.

The ports in the carrier may be disposed so as to lie in a horizontal plane with the filament assembly sweeping beneath the ports during rotation. Alternatively, the ports in the carrier may be comprised in the cylindrical wall of the carrier so that the filament assembly sweeps past and in alignment horizontally with the ports during rotation. The choice is dependent on the hollow articles and the particular type of carrier.

Where the ports in the carrier lie in a horizontal plane, the hollow articles may be placed on a top plate of the carrier and induced into sealed contact with the port seating by the high vacuum. Where the ports are formed in the cylindrical wall, a retainer to hold the hollow articles may be provided and this would hold the hollow articles in engagement with the respective seatings of the carrier until induced into tight engagement by the high vacuum.

The ports in the carrier may be arranged so that the filament can be loaded through one or more ports during the loading part of the cycle of metallising. A special loading port may be provided. However, this means that the position of the filament assembly at the end of its rotation must be carefully controlled, and advantageously the filament assembly can be loaded manually more readily by using a carrier in which the parts of the carrier are disassembled for loading. For instance, where the carrier comprises a top plate which mounts a bushing for the motor driven shaft on which the filament arm is mounted, this top plate can be lifted off a cylindrical or ring-like wall of the carrier which includes the ports with their respective seatings.

As afore-mentioned, the coating must be of uniform quality, in particular to give a constant colour hue. To assist in uniform deposition, there is an arrangement whereby a minute amount of Argon can be injected into the chamber when it is approaching the desired high vacuum. The injection may be done through a valve inlet connected to a supply of Argon at pressure with the inlet being disposed in the chamber.

Preferably, the apparatus includes two carriers arranged side by side on a table, each carrier being connected to a respective isolation valve but using a common high vacuum source such as a rotary pump and an oil diffusion pump. In use, the carriers are loaded and sequenced through the metallising cycle alternately so that one operator may load one carrier with hollow articles, whilst another batch of hollow articles on the other carrier are being coated. Such an arrangement is most efficient both for labour and for the pumping capacity of the pumps.

In known manner the cycle for loading and metallising may be controlled automatically by a sequence controller. Additionally, the apparatus may have safety features and gauges and manually operable controls or over-rides.

This invention has been developed particularly, but not exclusively for coating with gold and aluminum.

Other features of this invention will be described later with reference to the exemplary embodiment of the invention shown in the accompanying schematic drawings wherein:

BRIEF DESCRIPTION OF THE DRAWINGS

FIG. 3 is a diagrammatic plan view of the apparatus shown in FIG. 2;

FIG. 4 is an enlarged diagrammatic detail of part of the carrier and filament assembly;

FIG. 5 is an enlarged detail on line 5—5 of FIG. 4;

DESCRIPTION OF THE PREFERRED EMBODIMENT

Figure 1:
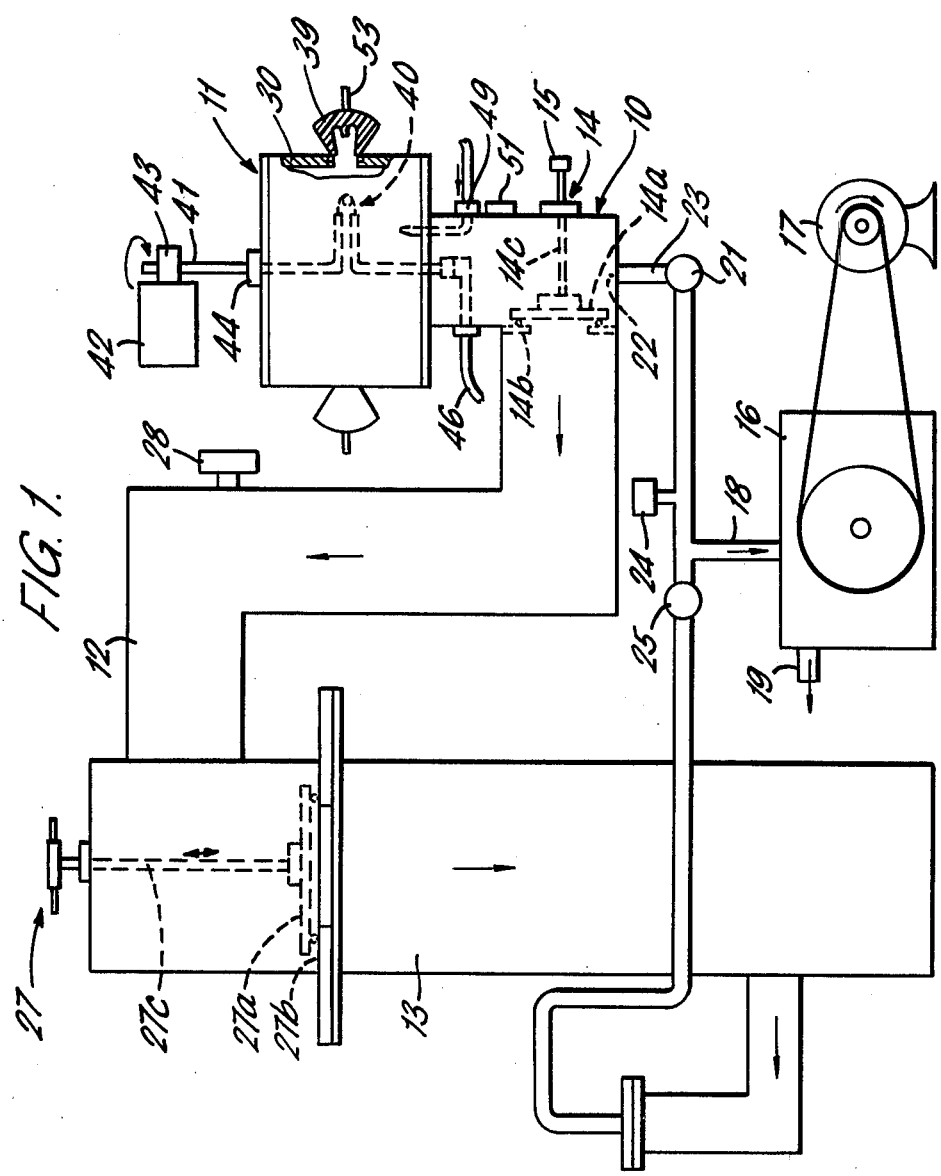
FIG. 1 is a diagrammatic side elevation of vacuum metallising apparatus according to this invention.
Figure 2:
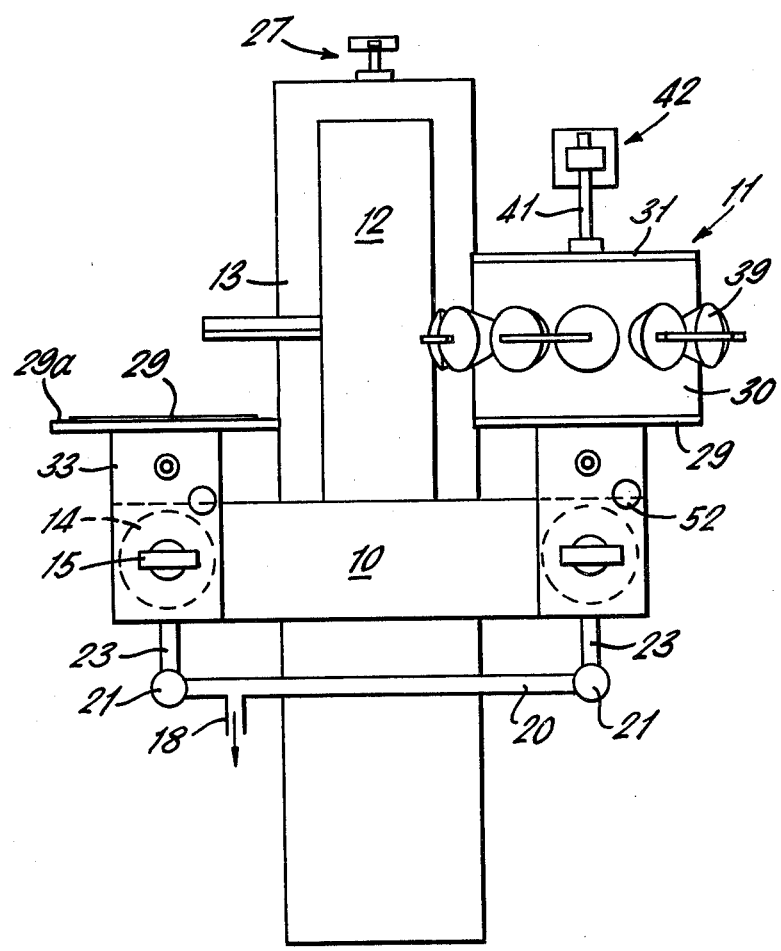
FIG. 2 is a diagrammatic front elevation of the apparatus shown in FIG. 1 with the carrier being removed on one side of the apparatus.

With reference to the drawings of FIGS. 1, 2, and 3, the apparatus comprises a table 10 on which are mounted two carriers 11 side by side. Through ducts (not shown in detail) under the table 10 the interior of each carrier is connected to a large duct 12 rising to the top of an oil diffusion pump 13. The communication between the interior of each carrier 11 and the rising duct 12 is controlled by a respective isolation valve 14 of which an operating handle 15 is mounted for manual operation on the front panel of the table 10.

A roughing pump 16 driven by a motor 17 has an inlet 18 and an exhaust outlet 19 to atmosphere. The inlet 18 is connected through a duct 20 to each one of two roughing valves 21. Each roughing valve 21 is for controlling the exhaustion of the interior of the respective carrier 11 through a respective port 22 opening to a respective short duct 23 leading to the roughing valve 21. Disposed between the roughing valves 21 and the inlet 18 of the roughing pump 16 is a pressure gauge head 24 which may be of the Pirani type for measuring vacuum pressure.

The oil diffusion pump 13 is connected to the roughing pump 16 through a backing valve 25 in a return duct 26. Above the inlet to the oil diffusion pump 13 there is mounted an emergency isolation valve 27 which is shown in FIG. 1 in the closed position. The manually operable isolation valve 14 is also shown in the closed position for convenience. Each of these isolation valves is similar and comprises a circular plate 27a, 14a, respectively, which carry a seal adapted to engage an internal seating 27b, 14b, respectively. The plate 27a, 14a is connected to a shaft 27c, 14c, respectively, and arranged for axial movement towards and away from the respective seating 27b, 14b. In the case of the emergency isolation valve 27, this is normally held open in use of the apparatus and is only closed should an emergency arise such as a sudden change in pressure, loss of electric power, or a failure of the other isolation valve 14. In particular, the emergency isolation valve 27 is provided to protect the oil diffusion pump 13. It may operate automatically and be operable manually.

In the rising duct 12 there is provided another gauge head 28 for measuring high vacuum and this may be of the Penning type. It is noticeable that the rising duct 12 is of large section and this enables the duct 12 to serve as a reservoir of high vacuum which is constantly measured by the gauge 28. This improves cycle times and avoids the provision of a separate large reservoir or tank.

Figure 6:
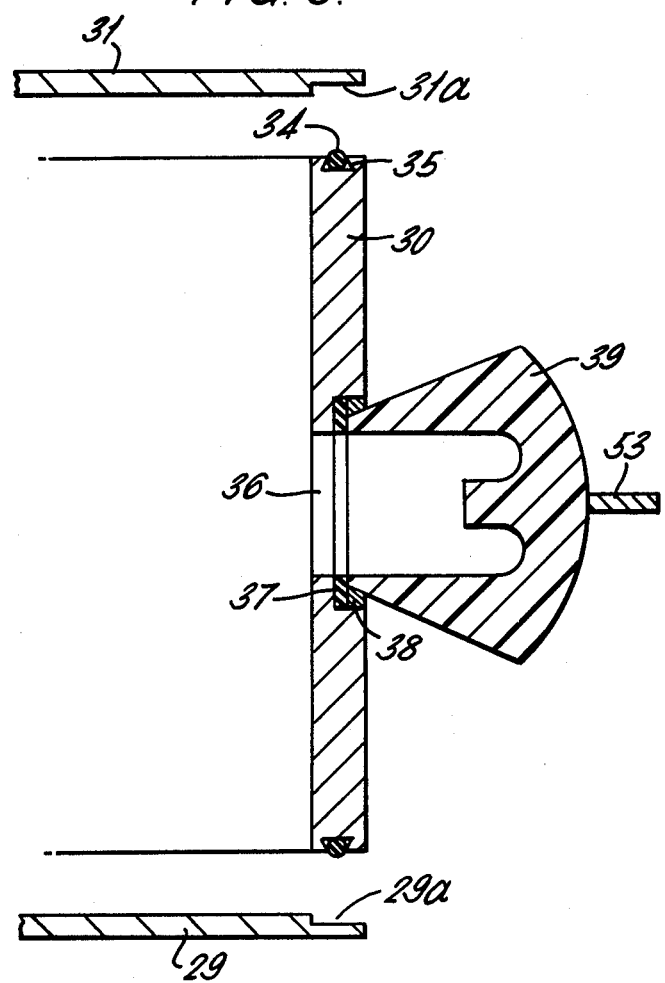
FIG. 6 is a diagrammatic sectional view on line 6—6 of FIG. 4.

Each carrier 11 and its associated parts are the same and only one will now be described with reference also to FIGS. 4, 5 and 6.

The carrier 11 comprises an annular bottom plate 29, a right-cylindrical tubular body 30, and a top plate. These parts define a shallow cylindrical chamber 32. The bottom plate 29 opens to a mounting duct 33 on the table 10 which leads to the isolation valve 14 and the port 22. The body 30 carries on each opposed face an O-ring 34 which is received within a respective undercut groove 35 extending adjacent to the periphery of the respective face. Both the top plate 31 and the bottom plate 29 are formed with annular peripheral rebates 31a and 29a respectively which provide both location and sealing faces for the body 30.

The body 30 is provided with a plurality of ports 36 which are arrayed in a circle around the side wall of the body 30 in spaced apart positions. Each port 36 is counter-bored to provide a rebate in which a rubber or elastomeric sealing ring 37 is received. A guide ring 38 having a tapered centre is fitted in each port 36 and seats on the respective sealing ring 37 and provides a lead-in surface for locating a hollow tap body 39 in the port 36.

A filament assembly 40 is mounted within the chamber 32 for rotation about a vertical axis coaxial with the body 30. The assembly is mounted on a shaft 41 arranged to be driven by a motor 42 and a gear box 42 carried above the carrier 11. The shaft 41 extends through a pressure tight bushing 44 located centrally in an opening of the top plate 31. The filament assembly 40 is mounted above the lower end of the shaft which is supported for bearing loads on a thrust bearing assembly 45 which also provides a wiping electrical contact for the power supply to the filament through an electrical lead 46. The earthing is effected through the shaft 41.

As shown best in FIG. 4 and 5, the filament assembly 40 comprises an arm 47 fixed at one end to the shaft 41 with the free end mounting a spiral wound filament 48. The arm 47 comprises two plates 47a and 47b which are connected together in an insulated manner by fixings 47c. One end of the filament wire 48 is connected to one plate 47a, and the other end is connected to the other plate 47b. The length of the arm 47 and the wound length of the filament 48 are chosen in accordance with the diameter of the chamber 32 and the port 22. The arrangement is such that when the shaft 41 rotates, the filament arm 47 sweeps around the chamber passing closely past each port 22 in succession whilst the coating metal hung or mounted on the filament 48 is vaporised by the heat of the filament.

The number and size of the ports 36 in the body 30 may be selected in accordance with the size of the hollow articles to be coated internally, and the number of ports may be selected having regard to the volume and coating surface area of the hollow articles. However, as will be appreciated, the number and size of ports can be varied by providing interchangeable bodies. Additionally, different filament assemblies may be employed.

A needle valve 49 is connected to a supply of Argon gas for discharging a small quantity of Argon into the chamber 32 through a jet 50 which is disposed adjacent the communication between the chamber 32 and the mounting duct 33. Additionally, a valve 51 for admitting air to the chamber is also mounted in the duct 33 and has a manually operable control 52 extending on the front panel of the table 10.

As is also shown in FIGS. 3 and 4, the body 30 of the carrier 11 has a series of retainers 53 secured thereto by small tension springs 54. These retainers 53 are for keeping the tap bodies 39 in position within the ports 36 during loading and the initial part of the cycle. Each retainer holds two tap bodies in place by means of each end engaging the top of a respective body 39. Other suitable retaining devices could be employed.

Figure 7:
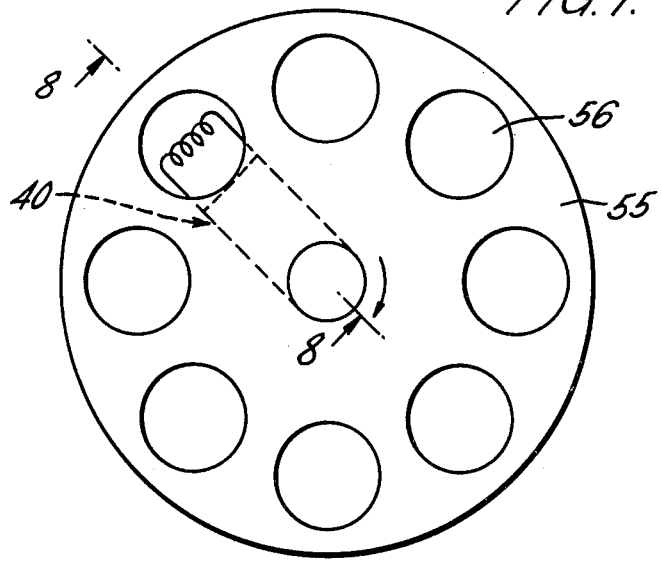
FIG. 7 is a diagrammatic plan view of a carrier of a different type.
Figure 8:
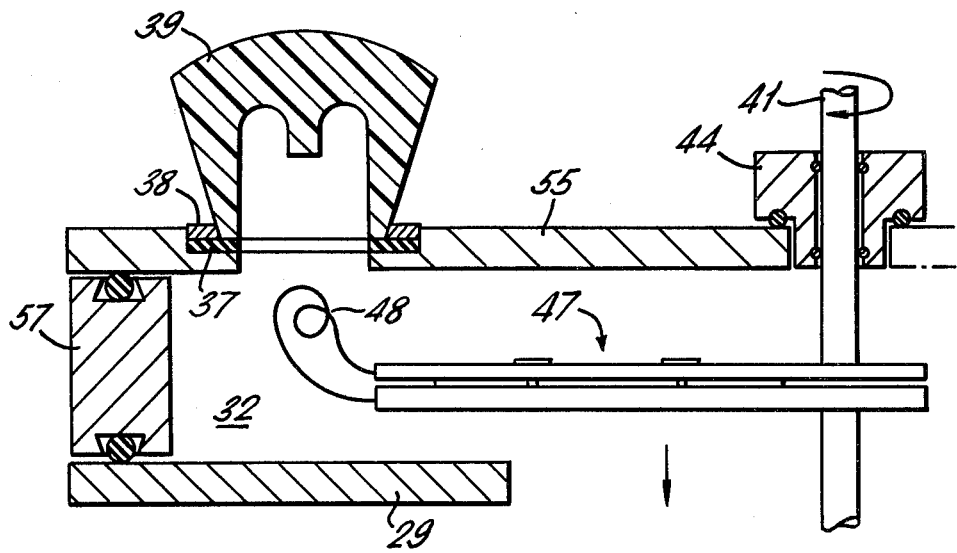
FIG. 8 is an enlarged diagrammatic sectional view on line 8—8 of FIG. 7.

Before describing how the apparatus is used, it is convenient here to refer to the drawings of FIGS. 7 and 8 which depict an alternative type of carrier.

The alternative type of carrier comprises an annular bottom plate 29 the same as previously described. The top plate 55 is provided with the array of ports 56 which are spaced apart in circular plan. Each port 56 is fitted with a sealing ring and tapered ring as previously described. The side wall of the cylindrical chamber 32 is defined by a cylindrical tube 57 of which the opposed faces carry O-ring seals 34 in respective undercut grooves 35.

The filament assembly 40 is substantially the same as that previously described but the filament 48 is wound slightly differently so that it extends upwardly towards the array of ports 56. As previously described, the filament assembly is mounted on the shaft for rotation therewith.

This alternative carrier is suitable for larger hollow articles, and has the advantage that no retainers are necessary as the articles may be merely rested on the top plate until they are induced into tight sealed engagement when the chamber pressure is reduced.

The sequence of operation is controlled by suitable electrical controls, preferably of the stepping type and which are responsive to pressures and other signals such as time, temperature and current loading. These controls form no part of this invention.

The apparatus would be put ready for operation by the initial starting operation of starting the roughing pump. Opening the backing valve, starting the oil diffusion pump, opening the emergency isolation valve and switching on the high vacuum gauge. One carrier is loaded with tap bodies and the filament is loaded with the metal to be vaporised. This is done by removing the top plate and the body as a unit in the first embodiment, but in the alternative type of carrier, the filament could be loaded through a port or the carrier dissassembled in the same manner as the first embodiment. The loaded part of the carrier is then placed on the bottom plate.

The air admittance valve is closed by the operator, and the roughing valve is opened. The chamber and the mounting duct is then reduced to the roughing pressure of about 0.5 mm Hg. and this only takes a short time because the volume of the chamber and mounting duct is very small. When the roughing pressure is reached, the roughing valve is closed. The operator manually opens the isolation valve to connect the chamber with the high vacuum obtaining in the rising duct and the oil diffusion pump. The pressure in the chamber is very quickly reduced to less than $10^{-4}$ mm Hg.

A trace of Argon gas is then admitted into the chamber until the pressure recorded on the high vacuum gauge is about $5 \times 10^{-4}$ mm Hg. Then the motor for driving the filament assembly is started and simultaneously the power supply to heat the filament is commenced so that the coating metal is vaporised whilst the filament assembly rotates. When the firing of the filament is over, the supply of Argon gas is stopped by closing the needle valve and the filament is cold by then.

The operator can then close the isolation valve and open the air admittance valve so that the inside of the chamber is opened to atmosphere and the carrier can be separated for unloading and reloading.

Whilst the metallising sequence was taking place, the operator would have been unloading and re-loading the other carrier and placing the loaded carrier on the other top plate. The loaded carrier would therefore be in the ready position when the operator closed the first mentioned isolation valve, and the controls are arranged so that when this is done the second roughing valve is opened so that the second carrier chamber is immediately being reduced to the roughing pressure.

This alternating of loading whilst the pumps are maintaining high vacuum even through the backing duct is most advantageous. Additionally, as it will be appreciated, several different types of carrier may be used with the same bottom plate so that a variety of hollow articles may be coated without interrupting the sequential steps of the metallising cycle. If the operator cannot manage to load and un-load, then a simple stack of carriers may be loaded ready by another person.

I have found that with the plastics materials used for hollow articles, such as tap bodies, there are considerable amounts of gasses evolved during the reduction to high vacuum and during the metallising stage. These gasses contribute to poor and non-uniform deposition of the coating metal if the pumping capacity is insufficient to remove them. It is for this reason that I have found that a high pumping capacity is required despite the relatively small volume of the chamber and the interiors of the hollow articles.

Additionally, the shape and configuration of the interior of the hollow bodies varies from type to type and often the inside is intricate. This means that when the coating metal is vaporised and follows its linear trajectory from the filament, certain parts of the body may cast a 'shadow' and which interferes with uniform deposition. The introduction of Argon during vaporisation gives an increased mobility to the atoms of the coating metal as they collide with the Argon atoms and are thus deflected from their normal linear path. This effect enables the coating atoms to be bounced within the hollow interior of the article and the 'shadow' is removed.

Accordingly, the use of Argon gas is preferred where the particular design of the hollow body is complex or where there is an internal projection or other interfering surface likely to give rise to the 'shadow' effect.

The advantages for increasing production and economy in operation achieved by the present invention will be apparent to those familiar with this field. Additionally, it will be understood that various alternatives for the layout of the apparatus can be made possible by changing the disposition of the various ducts. Indeed a multi-station apparatus could easily be based on the subject invention so that the apparatus was timed to operate in conjunction with a moulding line.

The relative dispositions of the pumps and ducts are not essential, and different types of high vacuum sources could be employed.

What is claimed is:

1. Vacuum metallising apparatus for coating the inside of hollow articles wherein a carrier for a plurality of said hollow articles has a plurality of seatings each for receiving one said hollow articles, said carrier being hollow and connected to a high vacuum source through suitable valve means, a filament assembly mounted inside said carrier for movement relative to said carrier whereby a filament of said filament assembly and carrying the metal for coating said hollow articles can be moved past and adjacent to each of said seatings during evaporation of said coating metal under high vacuum when a plurality of said hollow articles are each engaged with a respective one of said seatings and the interior of each said hollow article is at high vacuum.

2. Apparatus according to claim 1 wherein said carrier defines a shallow cylindrical chamber, and said valve means includes an isolation valve for controlling the communication of said chamber with said high vacuum source.

3. Apparatus according to claim 2 wherein said carrier includes a port opening to said isolation valve, and said filament assembly is mounted for coaxial rotation within said cylindrical chamber.

4. Apparatus according to claim 3 wherein said filament assembly comprises an arm mounted on a shaft co-axial with said chamber, a motor mounted externally of said chamber and for driving said shaft with said arm carrying said filament on which said coating metal can be supported and said arm being mounted for rotation with said shaft whereby during rotation the filament successively sweeps past each one of said seatings.

5. Apparatus according to claim 4 wherein said carrier comprises a bottom plate including said port opening to said isolation valve, a tubular body seated on said bottom plate and a top plate seated on said body.

6. Apparatus according to claim 5 wherein said seatings are provided in said carrier, each said seating being engaged in a respective port, said seating ports in said carrier being arrayed in a circle and relatively spaced apart.

7. Apparatus according to claim 6 wherein a supply of Argon gas is delivered into said chamber of said carrier through control valve means controlling delivery of said gas through a jet mounted in said chamber.

8. Apparatus according to claim 7 wherein said high vacuum source comprises an oil diffusion pump, a roughing pump connected to said oil diffusion pump through a backing valve, and the communication between said chamber and said oil diffusion pump being controlled by said isolation valve, and the communication between said chamber and said roughing pump being controlled by a roughing valve which is only permitted to open when said backing valve is closed.

9. Apparatus according to claim 8 wherein two stations each for mounting a respective one carrier are provided, each one of said stations being disposed adjacently and each having an associated isolation valve and a roughing valve for alternating operation whereby the carriers may be used alternately and only employing a single high vacuum source.

10. Apparatus according to claim 9 wherein said carrier is arranged for dissassembly for loading said filament with coating metal, and said ports are spaced peripherally around said tubular body, with means for retaining the hollow articles in engagement with the seatings being supported on said carrier.

* * * * *